United States Patent [19]

Sato

[11] Patent Number: 5,999,715

[45] Date of Patent: Dec. 7, 1999

[54] CIRCUIT DELAY OPTIMIZING USING CIRCUIT ARRANGEMENT, LAYOUT INFORMATION, AND WIRING DELAY INFORMATION

[75] Inventor: Koichi Sato, Tokyo, Japan

[73] Assignee: NEC Corporation, Tokyo, Japan

[21] Appl. No.: 08/825,399

[22] Filed: Mar. 28, 1997

[51] Int. Cl.$^6$ ................................................. G06F 17/00
[52] U.S. Cl. ................................. 395/500.06; 395/500.11
[58] Field of Search ..................................... 364/488, 489, 364/490, 491; 395/500.06, 500.11

[56] References Cited

U.S. PATENT DOCUMENTS

| 5,003,487 | 3/1991 | Drumm et al. | 364/489 |
| 5,461,576 | 10/1995 | Tsay et al. | 364/490 |
| 5,629,860 | 5/1997 | Jones et al. | 364/490 |
| 5,689,432 | 11/1997 | Blaauw et al. | 364/490 |

FOREIGN PATENT DOCUMENTS

| 3-292573 | 12/1991 | Japan . |
| 6310601 | 11/1994 | Japan . |

OTHER PUBLICATIONS

Ramachandran et al "Combined Topological and Functionality–Based Delay Estimation Using a Layout–Driven Approach for High–Level Applications," IEEE, pp. 1450–1460, Dec. 1994.

"Design Compiler Family Reference Manual", published by Synopsys Company in the U.S., pp. 8–21–8–26, 1995.

*Primary Examiner*—Kevin J. Teska
*Assistant Examiner*—Vuthe Siek
*Attorney, Agent, or Firm*—Foley & Lardner

[57] ABSTRACT

A circuit delay optimizing apparatus, includes an information input unit with a logic synthesizer unit that receives, from a layout unit, layout information after completion of layout of a circuit to be changed and wiring and wiring delay information represented by wiring capacitances and fan-out numbers of individual wiring lines. A circuit change portion searching unit searches the layout information to determine a circuit change on the basis of the wiring delay information. Wiring delay information after a circuit change is determined with respect to the change portion of the circuit, through a predetermined technique. A wiring capacitance after the circuit change is calculated by using a function of a fan-out number after the circuit change, a fan-out number before the circuit change and a wiring capacitance before the circuit change. A wiring delay time is calculated from the calculated wiring capacitance by using a predetermined function and the calculated delay time is used to determine if it is an improvement over the delay time before the circuit change. A circuit changing unit changes the circuit change portion only after an improvement is determined.

8 Claims, 4 Drawing Sheets

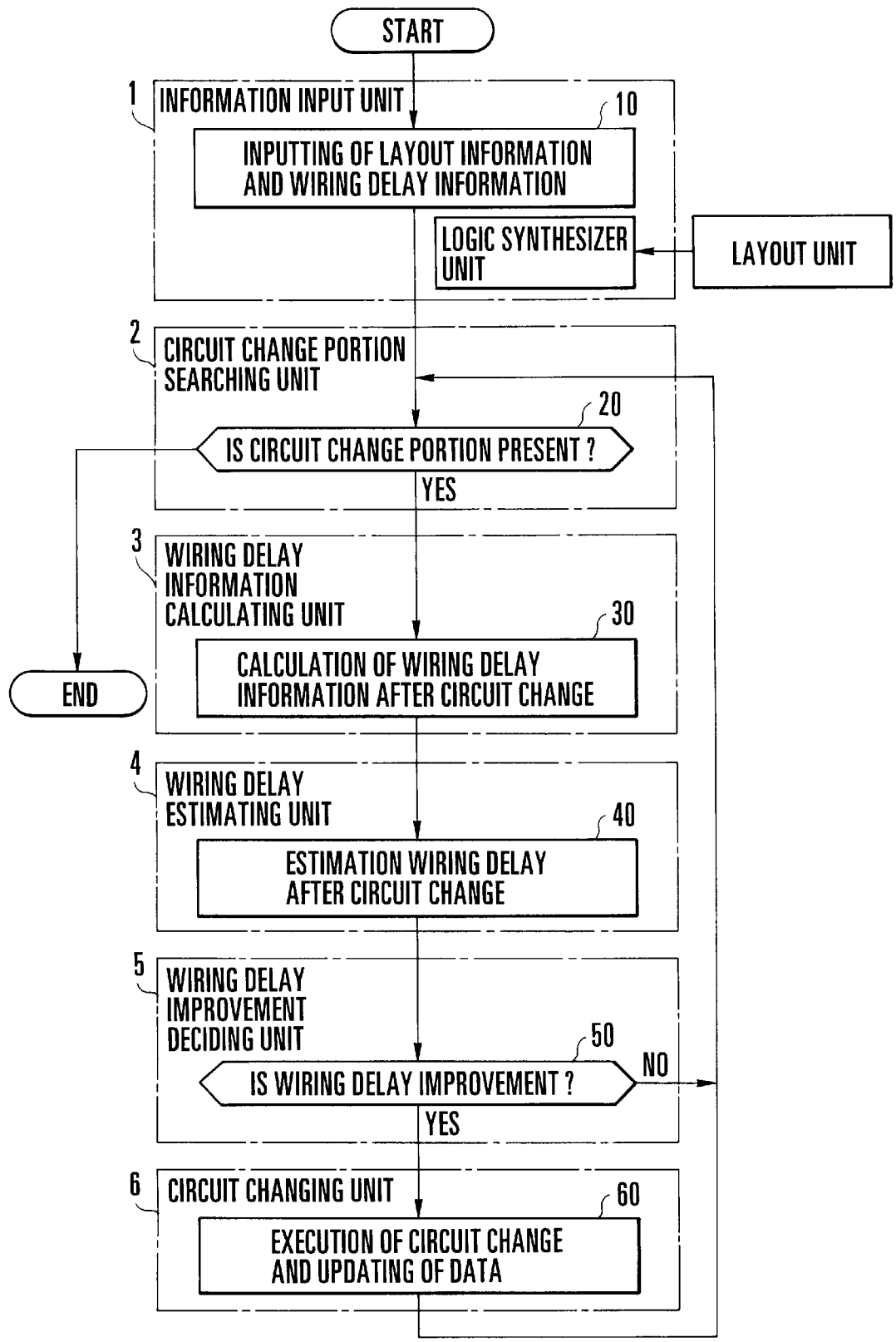
F I G. 1

C1=2pF C2=20pF C3=4pF
C4=10pF C5=6pF

C1=2pF C3=4pF C4=10pF
C5=6pF C6=12.7pF C7=12.7pF

C1 = 2pF   C2 = 20pF   C3 = 4pF
C4 = 10pF  C5 = 6pF

C1 = 2pF   C3 = 4pF   C4 = 10pF
C5 = 6pF   C6 = 3pF   C7 = 3pF

CIRCUIT DELAY OPTIMIZING USING CIRCUIT ARRANGEMENT, LAYOUT INFORMATION, AND WIRING DELAY INFORMATION

BACKGROUND OF THE INVENTION

The present invention relates to optimization of circuit delays and more particularly, to circuit delay optimizing method and apparatus which determine optimum delay times of individual wiring lines by using a circuit arrangement and layout information available after layout of a circuit and wiring delay information such as wiring capacitances and fan-out numbers (indicative of the number of wiring lines branching from one wiring line) which are factors of determining wiring delay times estimated after the layout of a circuit.

Delay optimization is one of techniques for logic optimization and is employed to change a circuit configuration in such a manner that expected values of timings at signal paths in a circuit are satisfied. When performing delay optimization of a circuit whose layout has once been completed, layout information containing, for example, wiring capacitances obtained as a result of the layout is sent to a logic synthesizing unit and the logic synthesizing unit performs accurate delay calculation over the whole circuit for the sake of changing the circuit.

Prior to execution of actual circuit change, a layout unit carries out layout by using circuit connection information (layout information) and calculates wiring delays on the basis of the layout and decides whether the wiring delays are improved. In connection with a layout portion at which the delay time is improved, the calculated delay time is fed back to the logic synthesizing unit, so that an actual circuit change is executed by changing the logic.

In other words, the logic is changed for the purpose of improving the delay time but layout is not carried out after the logic change and therefore, the delay time after the logic change can be determined by estimation. Further, in order to decide whether the logic change succeeds in improvement of the delay time, more accurate presumption (estimation) of delay time is again required after the logic change.

A delay in a circuit can be determined by a sum of a delay owned by a gate per se called a gate delay and a delay in wiring called a wiring delay. The wiring delay is a function of a wiring capacitance and can be determined from the wiring capacitance through the medium of a predetermined function. Accordingly, the wiring capacitance will be handled as the wiring delay in the following description. When layout wiring proceeds, the gate delay remains unchanged but the wiring capacitance will change depending on the manner of layout wiring. In the case where layout is effected after a circuit change, the layout unit proceeds with the processing by using the placement and routing information of the original layout and accordingly, it sometimes happens that the original wiring capacitance almost remains unchanged at a portion where the wiring pattern has not been changed but the wiring capacitance changes greatly from the original value at a portion where the wiring topology has been changed.

Conventionally, with a view of coping with this problem, when delays are calculated using wiring capacitances after layout to perform suitable delay optimization, wiring capacitances are statistically processed with respect to the fan-out numbers of individual wiring lines of the existing layout to prepare information in advance, and the capacitance of a wiring line whose pattern is changed or of a newly established wiring line is determined from a fan-out number of the corresponding wiring line in the information.

This is because the wiring capacitance in layout is considered to be a function of the fan-out number and therefore, a wiring capacitance of a wiring line newly established after optimization is estimated from the statistical information of the individual wiring lines of the existing layout. This technique is described in pages 8–21–8–26 of "Design Compiler Family Reference Manual" published by Synopsys Company in the US in 1995.

A processing flow of this type of conventional technique will be described with reference to FIG. 4. Firstly, in step 400, the layout unit establishes wiring layout of an object circuit and calculates layout information containing wiring capacitances to provide layout information of individual wiring lines corresponding to individual wiring lines of the same circuit inputted to a logic synthesizing unit.

Next, in step 401, all wiring lines are sorted in accordance with the fan-out number and wiring capacitances supplied as layout information with respect to individual wiring lines are statistically processed to determine a wiring capacitance corresponding to a fan-out number.

In step 402, a candidate for a circuit change in logic synthesis is searched. If no candidate exists, the procedure ends. If a candidate exists, the program proceeds to step 403 so as to try a candidate circuit change.

In step 403, a wiring capacitance after the circuit change is estimated from the statistical information and a fan-out number after the circuit change, and a delay is calculated through the medium of a predetermined function. For a portion intact to the circuit change, layout information obtained from the layout unit is used without alteration.

In step 404, it is decided whether the delay after the circuit change is improved over that before the circuit change. If the delay is improved, the program proceeds to step 405 but if not improved, the circuit change is not adopted and another circuit change candidate is searched in step 402.

In step 405, the circuit change candidate is adopted and in step 406, data concerning the wiring capacitance of a portion which has been changed in wiring topology is updated. When a series of processes ends, the program returns to step 402 and a different circuit change candidate is searched.

The processing flow shown in FIG. 4 will be described more specifically by taking an instance where a circuit of FIG. 5 is changed by inserting a buffer 208 as shown in FIG. 6. In FIGS. 5 and 6, a circle corresponds to a gate of a circuit and an arrow connecting gates represents a wiring line, with the direction of the arrow indicating a direction of a signal flow.

In step 400, wiring capacitances associated with wiring lines 201 to 205 in FIG. 5 are calculated as 2 pF, 20 pF, 4 pF, 10 pF and 6 pF, respectively, to provide layout information. These wiring capacitances are assigned to corresponding wiring lines of the FIG. 5 circuit inputted to the logic synthesizing unit.

In step 401, the wiring capacitances are sorted with respect to the fan-out number. Namely, the wiring lines 201 and 203 having a fan-out number of 2 have wiring capacitances C1=2 pF and C3=4 pF and the wiring lines 202, 204 and 205 having a fan-out number of 3 have wiring capacitances C2=20 pF, C4=10 pF and C5=6 pF.

Next, these wiring capacitances are statistically processed to determine one wiring capacitance value with respect to the fan-out number. Here, they are averaged to indicate that a wiring capacitance value for one fan-out number is (2+4)

÷2=3 pF in the case of the fan-out number being 2 and a wiring capacitance value for one fan-out number is (20+10+6)÷3=12 pF in the case of the fan-out number being 3.

It is now assumed that in the subsequent step 402, a circuit change candidate as shown in FIG. 6 is found and then a buffer of gate 208 as shown in FIG. 6 is inserted to the circuit of FIG. 5 and the wiring line 202 of FIG. 5 is divided into wiring lines 206 and 207.

Since the circuit change candidate exists, a wiring capacitance of a portion at which the circuit change is effected is estimated in step 403. The wiring line 206 has a fan-out number of 2 and therefore, the 3 pF wiring capacitance for the fan-out number being 2 is taken out of the statistical information and assigned to wiring capacitance C6 of the wiring line 6. Similarly, a wiring line 207 also having a fan-out number of 2 has wiring capacitance C7 to which 3 pF is assigned. By using these wiring capacitance values, wiring delays are estimated through the medium of the aforementioned predetermined function.

Next, in step 404, it is decided whether the delay of this circuit is improved. If improved, the circuit of FIG. 5 is changed to the circuit of FIG. 6 in step 405 and, in step 406, the wiring capacitance is updated to the value estimated in step 403. When a series of processes ends, the program returns to step 402 and another circuit change is tried.

In the wiring delay estimation in the conventional delay calculation, the wiring delay is calculated using a wiring capacitance determined in one-to-one correspondence to the fan-out number. This means that when wiring optimization is carried out and the wiring is changed, the same wiring capacitance is constantly determined for the same fan-out number.

Generally, as the length of wiring line increases, the wiring capacitance increases but in the conventional method, the distance between gates to be connected to each other is not taken into consideration. Accordingly, there is a possibility that the wiring capacitance of a wiring line which is originally long is underestimated.

Especially, with advanced miniaturization of circuits, the ratio of the wiring capacitance to the circuit total delay increases and a large error in the wiring capacitance prevents accurate delay calculation. A failure to perform accurate delay calculation raises a problem that effective delay optimization cannot be achieved.

SUMMARY OF THE INVENTION

An object of the present invention is to provide a circuit delay optimizing method and apparatus which can afford to provide proper delay optimization by taking the length of wiring into consideration.

To accomplish the above object, a circuit delay optimizing method according to the present invention comprises the steps of:

inputting layout information obtained after completion of arrangement of a circuit to be changed and of wiring and wiring delay information represented by wiring capacitances and fan-out numbers which are factors of determining delay times of individual wiring lines;

searching the layout information to determine a circuit change portion at which the circuit must be changed on the basis of the wiring delay information;

determining wiring delay information after a circuit change which is obtained when the change portion of the circuit is changed, through a predetermined technique;

calculating a wiring capacitance after the circuit change by using a function of a fan-out number after the change, a fan-out number before the change and a wiring capacitance before the change;

calculating a wiring delay time from the calculated wiring capacitance through the medium of a predetermined function and deciding whether the calculated delay time is improved over the delay time before the circuit change; and actually changing the circuit change portion only after an improvement is determined in the decision step.

A circuit delay optimizing apparatus according to the present invention comprises:

input means having a logic synthesizing unit and receiving, from a layout unit, layout information after completion of arrangement of a circuit to be changed and of wiring and wiring delay information represented by wiring capacitances and fan-out numbers which are factors of determining delay times of individual wiring lines, the layout information and wiring delay information being supplied to the logic synthesizing unit;

circuit change portion searching means for searching the layout information to determine a circuit change at which the circuit must be changed on the basis of the wiring delay information;

means for determining wiring delay information after a circuit change when the circuit change is effected with respect to the change portion of the circuit, through a predetermined technique;

calculation means for calculating a wiring capacitance after the circuit change by using a function of a fan-out number after the circuit change, a fan-out number before the circuit change and a wiring capacitance before the circuit change;

decision means for calculating a wiring delay time from the calculated wiring capacitance through the medium of a predetermined function and deciding whether the calculated delay time is improved over the delay time before the circuit change; and circuit change means for causing the logic synthesizing unit to actually change the circuit change portion only after an improvement is determined by the decision means.

In the circuit change portion searching, the circuit change portion is determined by deciding whether delay times of individual wiring lines at the circuit change portion are larger than an expected value.

In an embodiment, the wiring capacitance after the circuit change is calculated by multiplying a ratio of the fan-out number before the circuit change to the fan-out number after the circuit change by the wiring capacitance before the circuit change.

In another embodiment, the wiring capacitance after the circuit change is calculated by using the fan-out number after the circuit change which is subtracted by one.

BRIEF DESCRIPTION OF THE DRAWINGS

FIG. 1 is a diagram showing the construction of an embodiment of the present invention in terms of a flow chart.

DESCRIPTION OF THE PREFERRED EMBODIMENTS

Figure 2:
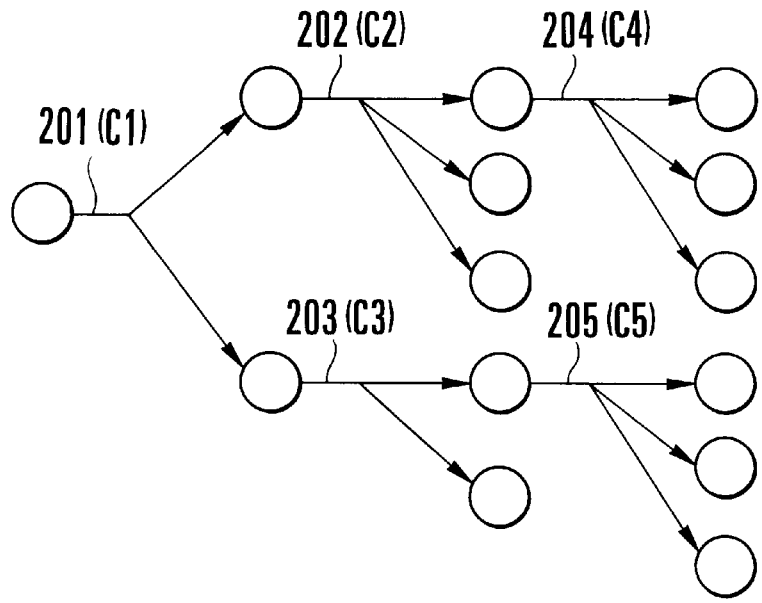
FIG. 2 is a diagram showing an example of a circuit before delay optimization in the embodiment of the present invention.

The present invention will now be described by way of example with reference to the accompanying drawings.

Referring to a schematic diagram of FIG. 1 showing a configuration of an embodiment of the present invention in accordance with process procedures, a circuit delay optimizing apparatus of the present invention comprises an information input unit 1, a circuit change portion searching unit 2, a wiring delay information calculating unit 3, a wiring delay estimating unit 4, a wiring delay improvement deciding unit 5, and a circuit changing unit 6.

The information input unit 1 is adapted to receive from a known layout unit layout information obtained after an object circuit is arranged and wiring is effected by the layout unit and wiring delay information represented by wiring capacitances and fan-out numbers which are factors of determining delay times of individual wiring lines.

The circuit change portion searching unit 2 is adapted to search a circuit change portion required to be subjected to a circuit change, on the basis of the wiring delay information from the information input unit 1. Available as a method of searching a circuit change candidate required to be subjected to a circuit change is a method of searching a so-called worst path which exhibits a remarkably longer delay time than an expected value of signal delay time. Since the delay time is a function of the wiring capacitance in the wiring delay information, a method is conceivable which performs determination on the basis of the wiring capacitance.

On the assumption that a circuit portion determined to be required of a circuit change by the circuit change portion searching unit 2 and the circuit change of the circuit portion is carried out in accordance with a predetermined technique to be described later, the wiring delay information calculating unit 3 operates to calculate a fan-out number after the circuit change.

The wiring delay estimating unit 4 is adapted to estimate a wiring capacitance after the change by using the calculated fan-out number, a fan-out number before the change and a wiring capacitance before the change and estimate a wiring delay from the estimated wiring capacitance through the medium of a predetermined function. An example of an estimation formula for estimation of the wiring capacitance will be described hereinafter.

The wiring delay improvement deciding unit 5 decides whether the estimated wiring delay time after the circuit change is improved over the delay time before the change.

When a decision result by the deciding unit 5 indicates an improvement, the circuit changing unit 6 operates to actually execute the circuit change and update data of the layout information and the wiring delay information. If the decision result does not indicate an improvement, showing that the change is meaningless, any circuit change will not be executed.

Next, the operation of the embodiment of the present invention will be described. In step 10, layout information and wiring delay information for individual wiring lines obtained from the layout unit are inputted and supplied to a known logic synthesizing unit. Since the wiring delay information is handled as the wiring capacitance, the wiring delay information contains wiring capacitances and fan-out numbers.

In step 20, a circuit change candidate is searched. In searching, a so-called worst path search is executed as described previously and in the absence of a circuit change candidate, the program ends. In the presence of a candidate, a circuit change is effected for that portion in accordance with a predetermined change technique to be described later and a fan-out number of a wiring line after that change is determined in step 30.

In step 40, in order to estimate a wiring capacitance after the change in consideration of the length of the wiring line represented by the wiring capacitance before the change, a wiring capacitance after the change is estimated using a function of a fan-out number after the change, a fan-out number before the change and a wiring capacitance before the change. Further, a wiring delay after the change is estimated from the estimated wiring capacitance through the medium of the predetermined function.

In step 50, it is decided whether the wiring delay after the change is improved over that before the change and if improved, the logic synthesizing unit is caused to actually execute the circuit change and data of the layout information and wiring delay information is updated in step 60.

If no improvement is determined in step 50, that circuit change is not adopted and the program returns to step 20 where a next circuit change candidate is searched.

By taking a circuit of FIG. 2 as an example, details of the operation of the embodiment of the invention will be described. In the circuit of FIG. 2, a circle corresponds to a gate of the circuit and an arrow connecting gates represents a wiring line, with its direction indicating a direction of flow of a signal.

It is now assumed that layout information inputted in step 10 indicates that wiring capacitances of wiring lines 201 to 205 in FIG. 2 are 2 pF, 20 pF, 4 pF, 10 pF and 6 pF, respectively. These wiring capacitances are assigned to corresponding wiring lines of the FIG. 2 circuit inputted to the logic synthesizing unit in step 10.

In step 20, a candidate for a circuit to be changed is searched. A searching method is exemplified as searching of a worst path having a wiring capacitance which is larger than an expected value of wiring capacitances of individual wiring lines. Assumptively, the wiring line 202 is determined as a worst path in the example of FIG. 2.

This wiring line 202 is changed in accordance with the predetermined circuit change technique and a fan-out number after the change is determined as wiring delay information in the next step 30.

Figure 3:
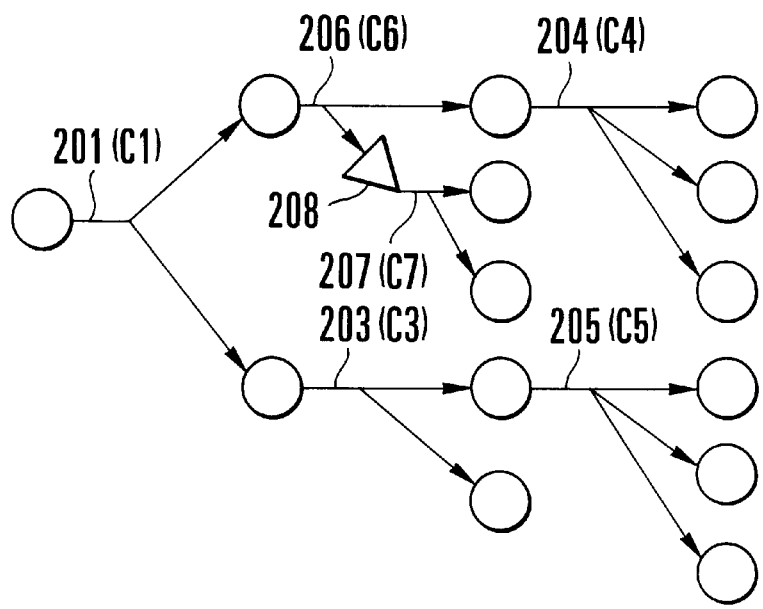
FIG. 3 is a diagram showing an example of a circuit after delay optimization in the embodiment of the present invention.
Figure 4:
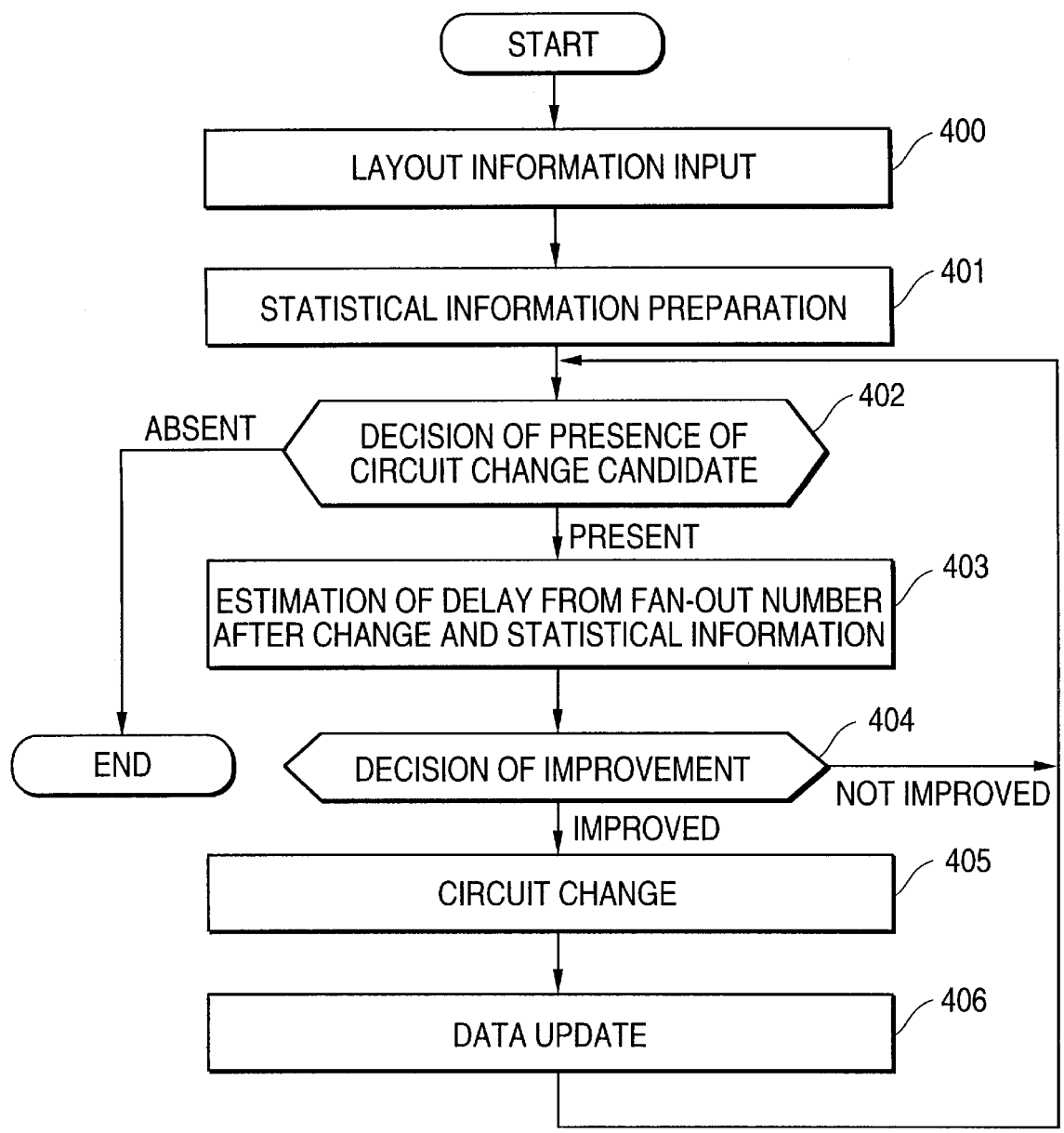
FIG. 4 is flow chart showing the processing in the conventional method.
Figure 5:
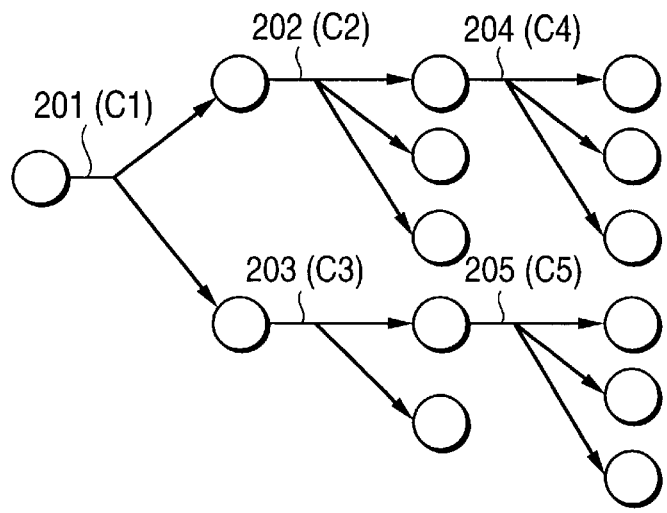
FIG. 5 is a diagram showing a circuit before delay optimization in the conventional method.
Figure 6:
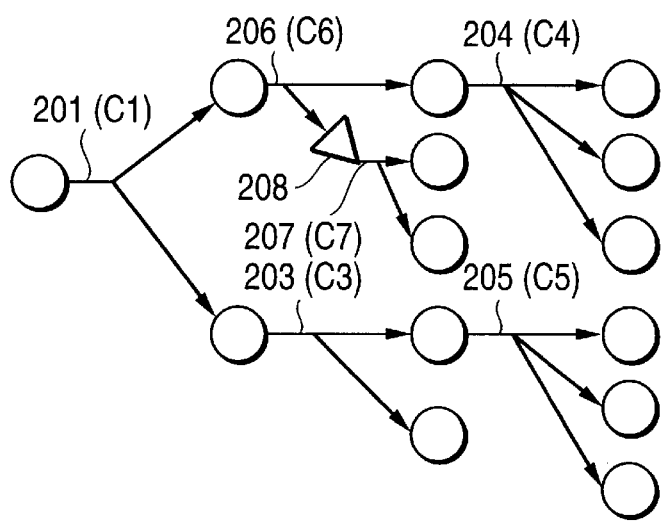
FIG. 6 is a diagram showing a circuit after delay optimization in the conventional method.

As the predetermined circuit change technique, a change technique is employed in which as shown in the conventional circuit of FIG. 6, in order to decrease the capacitance (depending on the length of wiring and the fan-out number) of the wiring line 202, a buffer of gate 208 as shown in FIG. 3 is inserted so that the fan-out number of the wiring line 202 may be decreased to 2.

Next, in step 40, the wiring delay after the circuit change is estimated. The wiring capacitance of the original wiring line 202 is changed to wiring capacitances of wiring lines 206 and 207 in FIG. 3. Wiring capacitance $C_i$ of the wiring line 206 is calculated by using a function of wiring capacitance $C_j$ of the wiring line 202 before the circuit change, the fan-out number $f0_j$ before the circuit change and a fan-out number $f0_i$ after the circuit change, pursuant to equation (1):

$$Ci=f(Cj, f0i, f0j) \qquad (1).$$

The estimation of the wiring capacitance to be carried out after the change can be changed in accordance of a manner of determining the function of equation (1) to thereby provide estimation of the wiring capacitance which closely reflects an actual wiring delay.

In a first embodiment of the present invention, equation (1) is specified as below:

$$Ci=Cj\cdot(f0i/f0j) \qquad (2).$$

This equation (2) holds on the assumption that the wiring capacitance after the circuit change is changed by a ratio between values of the fan-out number before and after the circuit change.

From equation (2), there results $$C6=20\times(2/3)=13.3 \text{ pF} \qquad (3)$$

in the case of the wiring line 206, and 13.3 pF can be estimated for the wiring line 207 similarly.

Equation (2) holds on the ground to be described herein. In FIG. 2, the wiring line 202 has a fan-out number of 3. When the layout is carried out such that three branching wiring lines according to this fan-out number 3 have each the same length, each of the branching wiring lines of wiring line 202 has a wiring capacitance which is obtained by dividing the wiring capacitance of that wiring line by the fan-out number.

When considering the wiring line 206 which is added with the gate 208 and divided after the change as shown in FIG. 3, on the assumption that in the wiring line 206, individual branching wiring lines shown in FIG. 2 remain unchanged in length, the wiring line 206 has a fan-out number of 2. Accordingly, the wiring capacitance of the wiring line 206 can be determined pursuant to equation (3) and more generally pursuant to equation (2).

Subsequently, in step 50, the delay of this circuit is decided as to whether to be improved. If the delay is improved, the circuit of FIG. 2 is permitted to be actually changed to the circuit of FIG. 3 in step 60 and at the same time, the wiring capacitance is updated to the value estimated in step 40 and the layout information is also updated. When a series of processes as above ends, the program returns to step 20 and another circuit change candidate is searched.

In the conventional technique, the estimated wiring capacitance is 3 pF and in spite of the fact that the fan-out number is slightly decreased from 3 to 2, the wiring capacitance is decreased greatly from 20 pF to 3 pF. When equation (2) is used, the wiring capacitance after the change can be set to a large value by taking into consideration the large wiring capacitance of the original wiring line 202, that is, the length of the wiring line inclusive of branching wiring lines.

Actually, however, the wiring capacitances of the wiring lines 206 and 207 change to some extent depending on the position where the buffer is inserted.

This is taken into consideration in a second embodiment of the present invention. The processing flow is quite the same as that of FIG. 1 but the wiring capacitance is estimated in step 40 pursuant to the following estimation equations:

$$Ci=\alpha\cdot Cj \cdot\{(f0i-1)/f0j)\} \qquad (4)$$

$$Ci=\beta\cdot Cj\cdot(f0i/f0j) \qquad (5).$$

Equation (4) is for estimation in the preceding stage of the inserted buffer 208 and equation (5) is for estimation in the succeeding stage of the inserted buffer 208. Equations (4) and (5) hold on the assumption that the buffer 208 is arranged near the preceding gate during layout. In this case, the fan-out number for the wiring line between the preceding gate and the buffer 208 is negligible and hence the numerator in equation (4) is (f0i−1).

When considering that the wiring making a side trip through peripherally arranged gates is prolonged to some extent, the wiring capacitance C6 of the wiring line 206 is 7.3 pF on the assumption that $\alpha$ is 1.1. Similarly, the wiring line 207 is prolonged to some extent when the wiring line connecting the buffer and the succeeding gate makes a side trip through peripherally arranged gates. Then, by using a variable of $\beta=1.2$, the wiring capacitance C7 of the wiring line 207 is 16.0 pF.

Equation (4) will now be described in greater detail. In equation (4), the numerator is (f0i−1) because the gate 208 to be added after the delay optimization is provided near the gate for driving the wiring line 206 and the fan-out number corresponding to the branching wiring line number is subtracted by one in the capacitance calculation in order to neglect the wiring capacitance preceding the gate 208.

In performing layout again, the additional gate can be designated by a layout tool such that it is arranged near the gate to be driven originally and through this, a more optimum delay can be determined by using equation (4) than by using equation (2).

As described above, according to the present invention, the wiring capacitances after the circuit change are estimated with respect to individual wiring lines from the wiring capacitances after the layout, the fan-out numbers before the circuit change and the fan-out numbers after the circuit change and in contrast to the conventional method, the wiring lines of the same fan-out number are not deemed to have the same wiring capacitance, thus attaining advantages that more accurate delay calculation can be ensured and proper delay optimization can be permitted.

What is claimed is:

1. A circuit delay optimizing method comprising the steps of:
   inputting layout information, obtained after completion of layout of a circuit to be changed, and wiring and wiring delay information represented by wiring capacitances and fan-out numbers which are factors for determining delay times of individual wiring lines;
   searching the layout information to determine a circuit change portion at which the circuit must be changed on the basis of the wiring delay information;
   determining wiring delay information after a circuit change, which is obtained when said circuit change portion is changed, through a predetermined technique;
   calculating a wiring capacitance after the circuit change by using a function of a fan-out number after the circuit change, a fan-out number before the circuit change and a wiring capacitance before the circuit change;
   calculating a wiring delay time from the calculated wiring capacitance by using a predetermined function;
   deciding whether the calculated delay time is an improvement over the delay time before the circuit change; and
   changing the circuit change portion only after an improvement is determined in said deciding step.

2. A circuit delay optimizing method according to claim 1, wherein in said circuit change portion searching step, the circuit change portion is determined by deciding whether delay times of individual wiring lines at said circuit change portion are larger than an expected value.

3. A circuit delay optimizing method comprising the steps of:

inputting layout information, obtained after completion of arrangement of a circuit to be changed, including wiring and wiring delay information represented by wiring capacitances and fan-out numbers which are factors for determining delay times of individual wiring lines;

searching the layout information to determine a circuit change portion at which the circuit must be changed on the basis of the wiring delay information;

determining wiring delay information after a circuit change, which is obtained when said circuit change portion is changed, through a predetermined technique;

calculating a wiring capacitance after the circuit change by using a function of a fan-out number after the circuit change, a fan-out number before the circuit change and a wiring capacitance before the circuit change;

calculating a wiring delay time from the calculated wiring capacitance by using a predetermined function;

deciding whether the calculated delay time is an improvement over the delay time before the circuit change; and changing the circuit change portion only after an improvement is determined in said deciding step, wherein said function for calculating a wiring capacitance after the circuit change is a multiplication of a ratio of the fan-out number before the circuit change to the fan-out number after the circuit change by the wiring capacitance before the circuit change.

4. A circuit delay optimizing method according to claim 3, wherein the fan-out number after the circuit change is subtracted by one.

5. A circuit delay optimizing apparatus comprising:

an information input unit having a logic synthesizer unit and receiving, from a layout unit, layout information after completion of layout of a circuit to be changed and wiring and wiring delay information represented by wiring capacitances and fan-out number which are factors for determining delay times of individual wiring lines, said layout information and wiring delay information being supplied to said logic synthesizer unit;

a circuit change portion searching unit that searches said layout information to determine a circuit change portion, at which said circuit must be changed, on the basis of the wiring delay information;

a wiring delay information calculating unit that calculates wiring delay information after a circuit change, when the circuit change is effected with respect to the circuit change portion, through a predetermined technique;

a wiring delay estimating unit that calculates a wiring capacitance after the circuit change by using a function of a fan-out number after the circuit change, a fan-out number before the circuit change and a wiring capacitance before the circuit change;

a wiring delay improvement deciding unit that determines a wiring delay time from the calculated wiring capacitance by using a predetermined function and deciding whether the calculated delay time is an improvement over the delay time before the circuit change; and a circuit changing unit that causes said logic synthesizer unit to change said circuit change portion only after an improvement is determined by said wiring delay improvement deciding unit.

6. The circuit delay optimizing apparatus according to claim 5, wherein the fan-out number after the circuit change is subtracted by one.

7. The circuit delay optimizing apparatus according to claim 5, wherein said circuit change portion searching unit determines the circuit change portion by deciding whether delay times of individual wiring lines are larger than an expected value.

8. A circuit delay optimizing apparatus according to claim 5, wherein said function that calculates the wiring capacitance after the circuit change is a multiplication of a ratio of the fan-out number before the circuit change to the fan-out number after the circuit change by the wiring capacitance before the circuit change.

* * * * *